United States Patent [19]

Virtanen

[11] Patent Number: 4,460,849

[45] Date of Patent: Jul. 17, 1984

[54] DEVICE FOR REGULATING THE POWER IN ELECTRICAL APPARATUSES, ESPECIALLY IN FLUORESCENT LIGHTING FITTINGS

[76] Inventor: Kalervo M. Virtanen, Metsäpekkalantie 2, 15610 Lahti 61, Finland

[21] Appl. No.: 355,609

[22] Filed: Mar. 8, 1982

[30] Foreign Application Priority Data

Mar. 30, 1981 [FI] Finland .................................. 810982

[51] Int. Cl.³ ...................... H05B 37/02; H05B 39/04; H05B 41/36

[52] U.S. Cl. ........................ 315/209 R; 315/DIG. 4; 315/DIG. 5; 315/DIG. 7; 315/224; 315/225; 315/207

[58] Field of Search .................. 315/DIG. 4, DIG. 5, 315/DIG. 7, 205, 207, 209, 224, 223, 291, 225

[56] References Cited

U.S. PATENT DOCUMENTS

| | | | |
|---|---|---|---|
| 3,774,074 | 11/1973 | Souvay | 315/DIG. 5 |
| 4,051,410 | 9/1977 | Knoble | 315/DIG. 5 |
| 4,150,323 | 4/1979 | Yeh et al. | 315/DIG. 5 |
| 4,228,382 | 10/1980 | Virtanen | 315/DIG. 4 |
| 4,286,195 | 8/1981 | Swinea, Jr. | 315/DIG. 5 |
| 4,319,164 | 3/1982 | Tulleners | 315/DIG. 5 |

Primary Examiner—Saxfield Chatmon
Attorney, Agent, or Firm—Scully, Scott, Murphy & Presser

[57] ABSTRACT

The invention relates to a device for regulating the power in electrical apparatuses, especially fluorescent lighting fittings. To each apparatus (6) is connected an inverter (1–5, 7–11; 12; 13) in which the control circuit of the oscillator transistor (1) is provided with an adjustable RC circuit (8, 9).

The power of a plurality of apparatuses included in the same group can be adjusted through one pair of conductors by connecting in parallel with the RC circuit (8, 9), on one hand, the contacts of a relay (10) and, on the other hand, an opto-insulator (11) whereby the relay (10) is connected to one conductor of the pair of conductors and the opto-insulator (11) to the other conductor.

4 Claims, 1 Drawing Figure

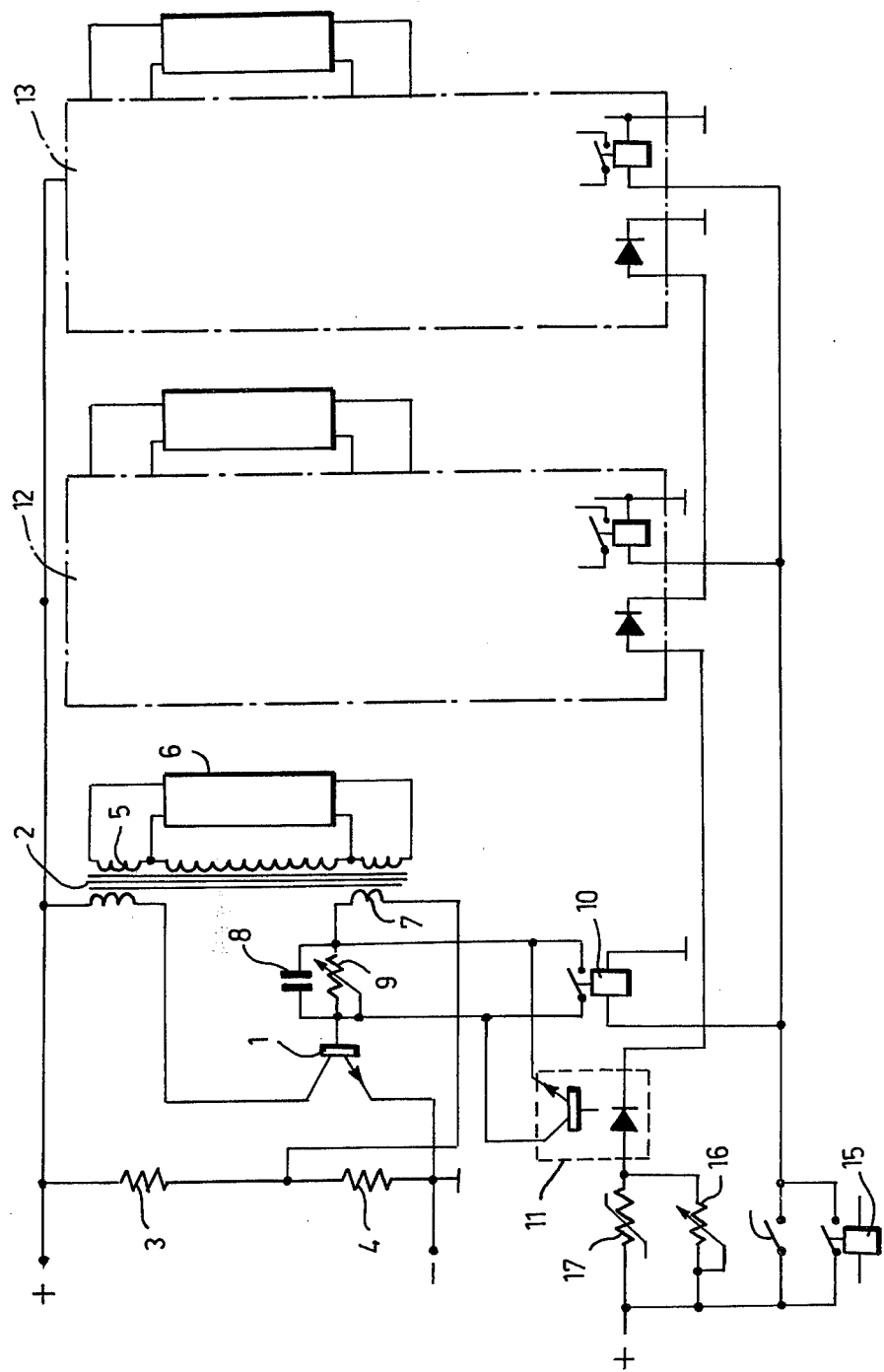

DEVICE FOR REGULATING THE POWER IN ELECTRICAL APPARATUSES, ESPECIALLY IN FLUORESCENT LIGHTING FITTINGS

The present invention relates to a device for regulating the power in electrical apparatuses, especially in fluorescent lighting fittings, said device comprising inverters connected across a DC source and including an oscillator transistor, the electrical apparatus being connected after said inverters and an adjustable RC circuit being connected across the control circuit of said oscillator transistor of each inverter for regulating the base current of the oscillator transistor. A device according to the invention is especially intended for use in vehicles, such as buses and trains, in which the voltage of the DC source is too low for a discharge lamp. For example, a flourescent tube requires for lighting and burning often a considerably higher voltage than that supplied by the current source, such as an accumulator.

It is previously known to regulate the power of fluorescent lighting fittings in vehicles by means of an adjustable RC circuit which is located in the control circuit of the oscillator transistor of an inverter. Because the current of the control circuit is low, the fixed capacitor and adjustable resistor, i.e. the potentiomete can be quite small-sized without any noteworthy loss of power occurring in them. Because the inventor of each fluorescent lighting fitting must have a RC circuit of its own and because the driver must be able to regulate the power of all fluorescent lighting fittings from his own place, the regulator group, particularly in a big bus, will be impractically large and the cable system between the inverters and regulators in the lighting fittings will be expensive and complicated.

The present invention seeks to provide a device by means of which the driver of a vehicle can simply by operating the circuit breaker and by pressing a button turn on all the fluorescent lamps in a vehicle with a preselected degree of dimming. All fluorescent lamps have a common power regulator which is connected to the inverters by using one pair of conductors irrespective of the number of inverters.

By means of the regulating resistor (rheostat) of the RC circuit in each inverter a basic condition is set for each inverter which is valid unless no other controls are present. According to the invention, a relay whose contacts entirely short-circuit the adjustable RC circuit or at last a part of it is connected parallel with the adjustable RC circuit. This relay is controlled by the driver by means of a press button or by means of a contact of the door relay. Parallel with the relay is further connected a continuously variable opto-insulator due to which the power of all inverters can be regulated by one single regulator element which may be either a potentiometer within the reach of the driver or an automatic regulator capable of proportioning the power of the fluorescent lamps to the lighting required in each particular instance.

In the device according to the invention the regulation of the fluorescent lighting fittings can be carried out by using one pair of conductors only. In addition, because the required control powers are very low, smallest cable size used in cars will be sufficient for the control cable.

Because of its versatile regulation possibilities, simple installation and high efficiency, the device according to the invention offers several advantages as compared to the presently known and use system.

When the driver closes the current switch, all the fluorescent lamps which by means of the present rheostat have been set to operate at not less than about one half full power will be lit. When he then closes the switch by-passing the regulating circuit, also the remaining lamps will be lit. When the switch again opens, the fluorescent lamps will be set on the preset power.

In the enclosed drawing, the circuit diagram of the present device is shown.

An oscillator transistor 1, a transformer 2, and resistors 3 and 4 form a freely oscillating oscillator or inverter. AC power is obtained from secondary winding 5 of the transformer 2 to a load 6 comprising, in the embodiment shown, a fluorescent lamp. An adjustable RC circuit comprising a capacitor 8 and a rheostat 9 is provided between the oscillator transistor 1 and a reactance coil 7. A micro-relay 10 and an opto-insulator 11 are connected in parallel with the adjustable RC circuit.

The above mentioned components form together an adjustable inverter with which also the inverters 12 and 13 identical. The number of inverters as such is not essential, and it may be any number required in each particular instance. The microrelay 10 is controlled by means of a driver's control switch 14 or by means of closing contacts of a door relay 15 through one single conductor. When the relay contact or the switch is closed, the fluorescent lamp will receive maximum power. In addition, in order to obtain a continuous regulation, the output side of the opto-insulator 11 in the inventer is connected via the same one conductor either to a potentiometer 16 or a photoresistor 17 or to both, as in the figure.

Because of the high lighting voltage required by fluorescent lamps, the switch 14 is closed when the lamps are being lit. After lighting, the switch 14 is opened and the fluorescent lamps will be set on the level preset by the rheostat 9. By his own rheostat 16 the driver may, if required, set the power of all lamps to a brighter level than the present level.

If a photoresistor 17 is connected to the system, it provides additional power as the ambient light increases. Instead of the photoresistor alone, it is also possible to use an electronic regulator by means of which the light can be increased or reduced in the desired manner with respect to ambient light.

What I claim is:

1. A circuit for regulating the electrical power supplied to a plurality of fluorescent lighting fixtures, comprising a plurality of inverter circuits connected across a DC source, each inverter ciruit including an oscillator transistor, each fluorescent lighting fixture being connected to a separate inverter circuit which includes an adjustable RC circuit connected in the control circuit of said oscillator transistor, and the contacts of a relay means and an opto-insulator being connected in parallel with said RC circuit of the control circuit of each oscillator transistor, and a common switch for controlling all of the relays of said inverter and a common control means for controlling all of the opto-insulators.

2. A regulating circuit as claimed in claim 1, wherein said common contol means includes a potentiometer.

3. A regulating circuit as claimed in claim 1, wherein the plurality of fluorescent lighting fixtures are mounted in a bus having a door, and further wherein the condition of said common control switch for said relays is dependent on the position of the bus door.

4. A regulating circuit as claimed 1, wherein said common control means for said opto-insulators comprises a photoresistor.

* * * * *